United States Patent
Lo et al.

(10) Patent No.: US 8,576,642 B2
(45) Date of Patent: Nov. 5, 2013

(54) METHOD OF USING MULTIPLEXING CIRCUIT FOR HIGH SPEED, LOW LEAKAGE, COLUMN-MULTIPLEXING MEMORY DEVICES

(71) Applicant: Taiwan Semiconductor Manufacturing Company, Ltd., Hsinchu (TW)

(72) Inventors: Bin-Hau Lo, Hsinchu (TW); Yi-Tzu Chen, Hsinchu (TW); C. K. Su, Luzhu Township (TW); Hau-Tai Shieh, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/866,782

(22) Filed: Apr. 19, 2013

(65) Prior Publication Data

US 2013/0229879 A1    Sep. 5, 2013

Related U.S. Application Data

(62) Division of application No. 12/905,317, filed on Oct. 15, 2010, now Pat. No. 8,451,671.

(51) Int. Cl.
*G11C 7/12* (2006.01)

(52) U.S. Cl.
USPC ............ 365/189.15; 365/189.02; 365/189.17; 365/233.17; 365/230.02

(58) Field of Classification Search
USPC ............ 365/189.02, 189.14, 189.15, 189.17, 365/233.17, 233.1
See application file for complete search history.

(56) References Cited

U.S. PATENT DOCUMENTS

| | | | |
|---|---|---|---|
| 6,104,655 A * | 8/2000 | Tanoi et al. | 365/205 |
| 8,018,257 B2 | 9/2011 | Jung | |
| 8,259,514 B2 | 9/2012 | Cho et al. | |
| 8,451,671 B2 * | 5/2013 | Lo et al. | 365/189.15 |
| 2004/0212406 A1 | 10/2004 | Jung | |
| 2008/0238514 A1 | 10/2008 | Kim | |
| 2011/0231723 A1 * | 9/2011 | Lee et al. | 714/731 |

FOREIGN PATENT DOCUMENTS

CN          1855183 A    11/2006

OTHER PUBLICATIONS

Office Action for Chinese Application No. 201110174982.2 dated Jun. 28, 2013.

* cited by examiner

*Primary Examiner* — Andrew Q Tran

(74) *Attorney, Agent, or Firm* — Lowe Hauptman & Ham, LLP

(57) ABSTRACT

In at least one embodiment, a multiplexer has a plurality of sub-circuits, and each of the plurality of sub-circuits has a first transistor, a second transistor, and a third transistor. Drains of the first transistors are coupled with a first terminal of a fourth transistor, and drains of the second transistors are coupled with a second terminal of the fourth transistor. In at least one embodiment, a method of outputting data using the multiplexer includes turning on the second transistor of a selected one of the plurality of sub-circuits responsive to a clock signal and address information. The second transistor of a non-selected one of the plurality of sub-circuits is turned off. The fourth transistor is turned on responsive to the clock signal.

20 Claims, 3 Drawing Sheets

METHOD OF USING MULTIPLEXING CIRCUIT FOR HIGH SPEED, LOW LEAKAGE, COLUMN-MULTIPLEXING MEMORY DEVICES

PRIORITY CLAIM

This application is a divisional application of U.S. application Ser. No. 12/905,317, filed Oct. 15, 2010, the disclosure of which is incorporated herein by reference in its entirety.

TECHNICAL FIELD

The present disclosure is related to a multiplexing circuit.

BACKGROUND

Many memory designs commonly use a column multiplexing structure to achieve a compact area. For high speed memory designs, e.g., in the Giga Hertz (Ghz) range, however, multiplexers having a large number N of inputs in some approaches increase the output delay (e.g., the slew rate) because of the heavy load when the N sub circuits in the multiplexers corresponding to the N number of inputs are coupled together. In some conditions, the N sub circuits coupled together also cause high leakage current.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
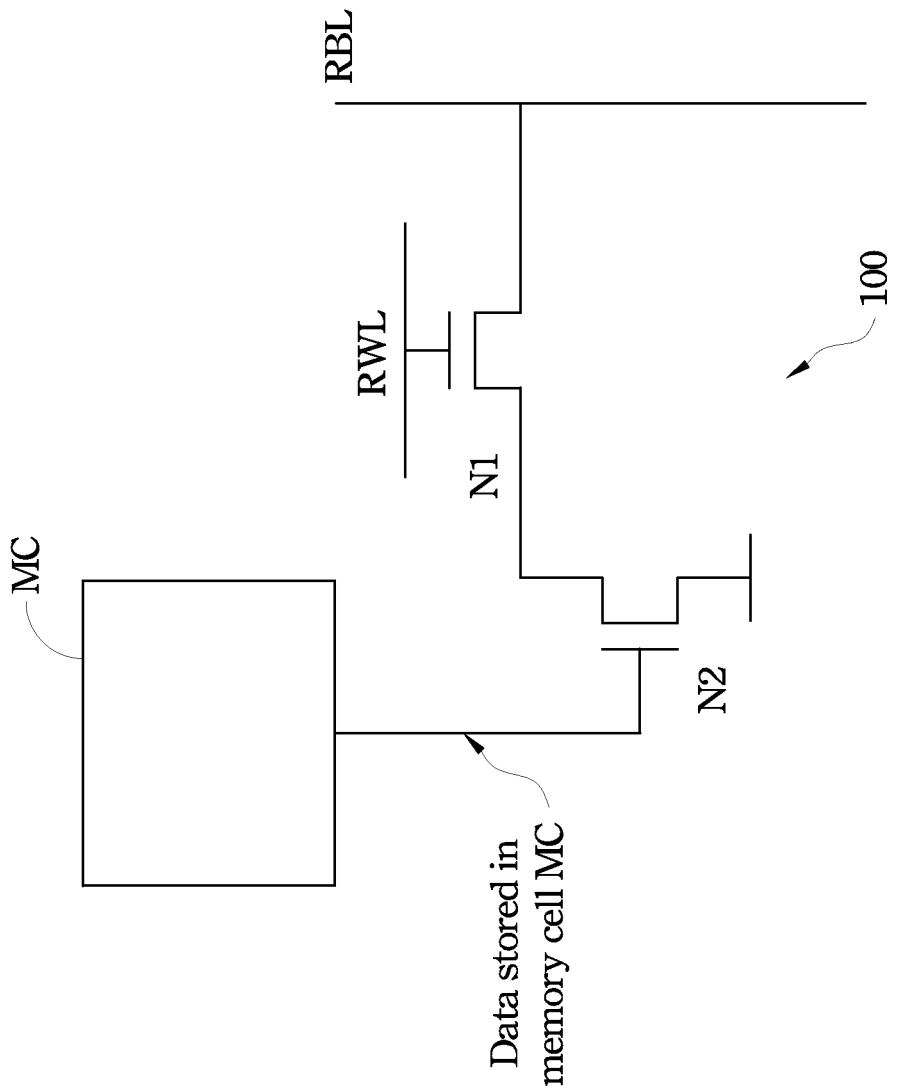
FIG. 1 is a diagram of a circuit illustrating an operation of a read bit line in conjunction a memory cell, in accordance with some embodiments.

Embodiments, or examples, illustrated in the drawings are now disclosed using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments have one or a combination of the following advantages and/or features. The read speed increases because the heavy load on the multiplexer output node is reduced (e.g., compared with other approaches). The leakage current in some conditions (e.g., when data on a read bit line is Low) is also reduced. The multiplexing circuit is suitable for high-speed multiple column-multiplexing memory designs.

Exemplary Circuit

FIG. 1 is a diagram of a circuit 100 illustrating an operation of a memory cell MC in conjunction with a read bit line RBL, in accordance with some embodiments.

Prior to reading data in memory cell MC, read bit line RBL is pre-charged to a high logic level (e.g., a High), and read word line RWL is activated (e.g., applied with a High) to turn on transistor N1. The logic level on read bit line RBL is then detected to indicate the data logic stored in memory cell MC that appears at the gate of transistor N2. In some embodiments, if the memory data is Low, then, at the time of reading, the data on RBL is High, and, if the memory data is High, the data on read bit line RBL is Low. For example, if the memory data is Low, transistor N2 is off, acting as an open circuit, and read bit line RBL remains High from the pre-charged level. If, however, the data is High, transistor N2 is on which, together with transistor N1 being on, pulls the logic level of read bit line RBL to the source of transistor N2, which is ground or Low. The logic level at read bit line RBL is then processed accordingly (e.g., inverted) to reflect the data stored in memory cell MC.

Figure 2:
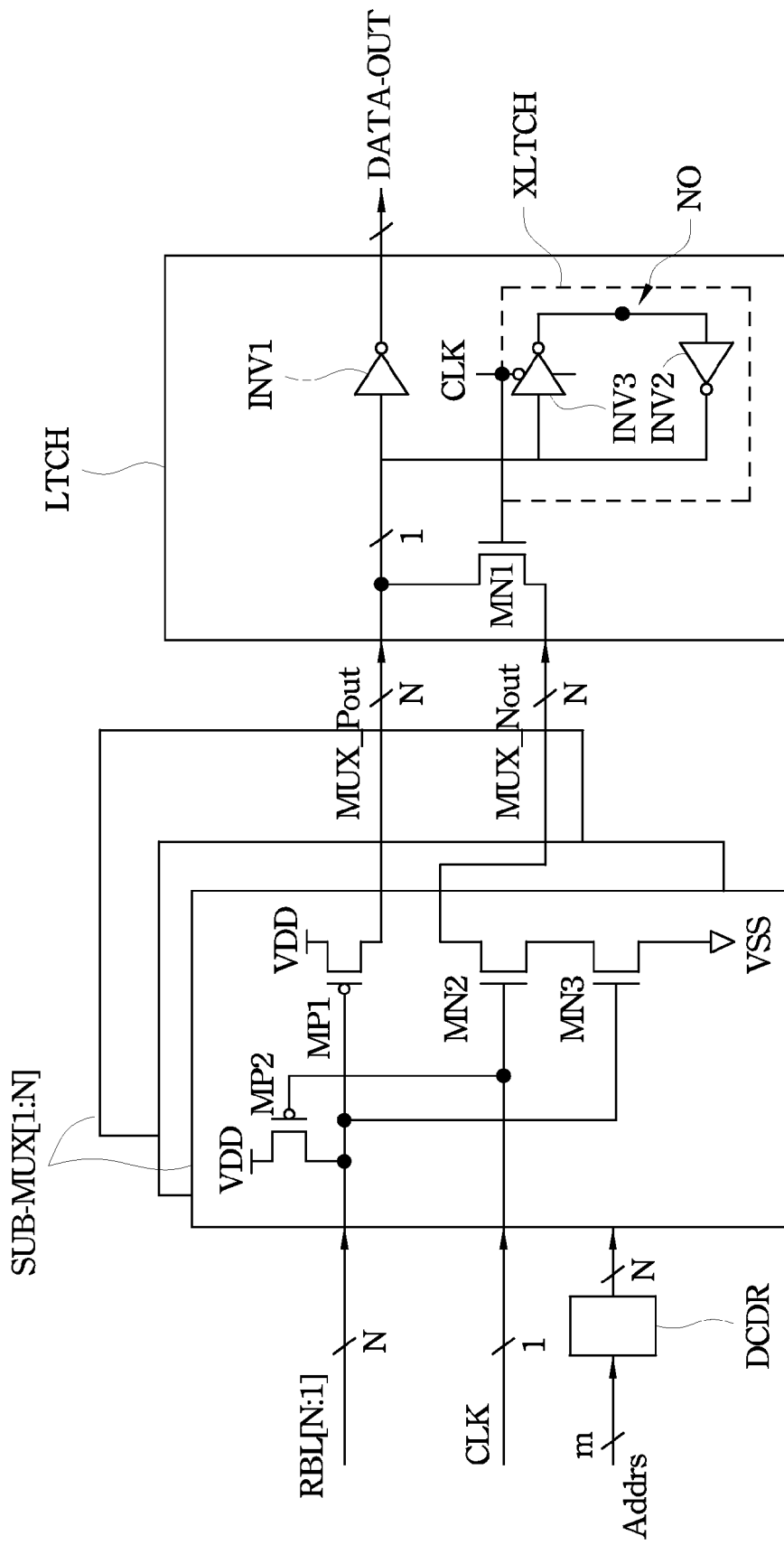
FIG. 2 is a diagram of an exemplary multiplexing circuit for N read bit lines of the circuit in FIG. 1, in accordance with some embodiments.

FIG. 2 is a diagram of an exemplary multiplexing circuit for N read bit lines of the circuit in FIG. 1, in accordance with some embodiments. In some embodiments, a memory array (not shown) has N number of columns that correspond to respective N number of read bit lines RBL (e.g., read bit lines RBL[1:N]) used with a multiplexer in a memory array, as illustrated in circuit 200 of FIG. 2 in which N sub circuits (e.g., circuits SUB-MUX[1:N]) form the multiplexer (e.g., multiplexer MUX, not labeled). Each circuit SUB-MUX corresponds to a read bit line RBL and thus a column of the memory array. Multiplexer MUX is commonly called an N-input multiplexer or N-input mux.

Column address decoder DCDR decodes m number of addresses Addrs to N number of lines to select a particular circuit SUB-MUX. As a result, $N=2^m$. For example, if m=2 then N=4 corresponding to circuits SUB-MUX[1], SUB-MUX[2], SUB-MUX[3], and SUB-MUX[4] In some embodiments, N number of addresses Addrs corresponds to N number of columns of memory cells in a memory array. N and m are positive integers.

Clock CLK is used as a first input for a circuit SUB-MUX to control data at output MUX_Pout, and thus data at output DATA_OUT, which is inverted from output MUX_Pout by inverter INV1. In some embodiments, clock CLK is a system clock (e.g., is from a system using the memory).

Each read bit line RBL of N number of read bit lines RBL[1:N] serves as a second input for a respective circuit SUB-MUX of N number of circuits SUB-MUX[1:N]. Each circuit SUB-MUX includes a pair of data lines (e.g., outputs) MUX_Pout and MUX_Nout coupled to latch LTCH, and each pair of data lines MUX_Pout and MUX_Nout is coupled to the drain and the source of transistor MN1, respectively. When a circuit SUB-MUX is selected, the pair of transistors MN2 and MN3 of the selected circuit SUB_MUX together with transistor MN1 serve as a current path for output MUX_Pout. At the same time, one or a combination of transistors MN2 and MN3 of (N−1) unselected circuits SUB-MUX is off. As a result, there is no current path from output MUX_Pout through transistors MN2 and MN3 of (N−1) unselected circuits SUB-MUX, and, consequently, there is no leakage current in (N−1) unselected circuits SUB_MUX. Further, in some embodiments, transistor MN1 enables advantages over other approaches in which the drains of N number of transistor MN2 are also coupled to output MUX_Pout and there is no transistor MN1. For example, in some embodiments, the capacitive loading at output MUX_Pout includes capacitance of N number of PMOS transistors MP1 plus that of one NMOS transistor MN1 as compared to that of N number of PMOS transistors MP1 and N number of NMOS transistors MN2. As a result, the slew rate of output MUX_Pout is faster.

Latch circuit LTCH stores the data on line MUX_Pout to node NO when clock CLK is Low. Transistor MN1 is shown as part of latch circuit LTCH for illustration, transistor MN1 could be outside of latch circuit LTCH and/or part of multiplexer MUX. In some embodiments, latch LTCH is an output latch of a plurality of columns of the memory array.

Exemplary Operation of Circuit 200

For illustration, a circuit SUB-MUX is selected by decoder DCDR based on address Addrs. Further, read bit line RBL corresponds to a memory cell having data to be read and to the selected circuit SUB-MUX, and is High (e.g., pre-charged prior to reading).

When clock CLK is Low, the gate of transistor MN2 is LOW, and transistor MN2 is off. At the same time, the gate of transistor MP2 is also Low, and transistor MP2 is on, causing a High at the drain of transistor MP2 or the gate of transistor MP1. As a result, transistor MP1 turns off and serves as an open circuit. Because transistor MN2 is off, there is no current path for transistor MN1 to ground, transistor MN1 also acts as an open circuit. Because transistor MP1 and transistor MN1 are open circuits, output MUX_Pout, going through inverters INV3 and INV2 of cross latch XLTCH, remains at its logic level. Alternatively stated, the data at output MUX_Pout is stored in node NO.

Prior to reading, because read bit line RBL is pre-charged to High, the gate of transistor MP1 is High, and transistor MP1 is off, serving as an open circuit. At the same time, the gate of transistor MN3 is also High, causing transistor MN3 to be on. When clock CLK turns High, the gate of transistor MP2 is High, and transistor MP2 turns off. At the same time, the gates of transistors MN1 and MN2 are High, causing transistors MN1 and MN2 to turn on, which pulls node MUX_Pout to the source of transistor MN3, which is ground or Low. As a result, output DATA_OUT, through inverter INV1, is High, which is the same as the data on read bit line RBL.

When read bit line RBL is Low (e.g., pulled down by transistors N1 and N2 in FIG. 1), the gate of transistor MP1 is Low, causing transistor MP1 to be on. As a result, output MUX_Pout is High from voltage VDD of transistor MP1, and output DATA_OUT, through inverter INV1, is Low, which is the same as the data on read bit line RBL.

In some embodiments, output MUX_Pout has a small/insignificant capacitance (e.g., Cpout, not labeled) compared to that of other approaches. As a result, the signal at output MUX_Pout has a faster slew rate (versus a slow slew rate when capacitance Cpout is high). Further, when output MUX_Pout is High, and transistors MN1, MN2, and MN3 are on, transistors MN1, MN2, and MN3 quickly pull output MUX_Pout to Low.

Exemplary Method

Figure 3:
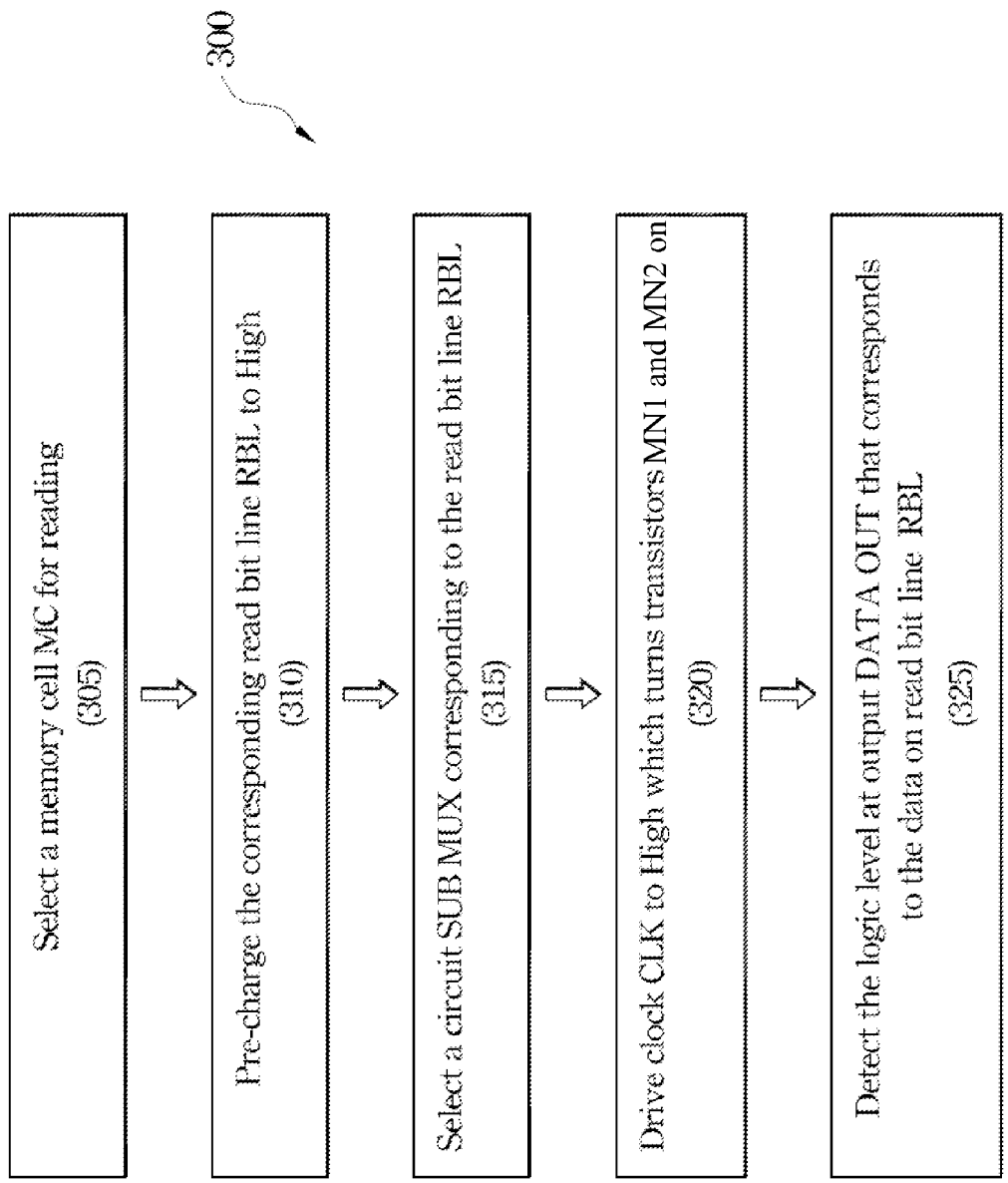
FIG. 3 is a flowchart illustrating a method of operating the circuit in FIG. 2, in accordance with some embodiments.

FIG. 3 is a flowchart illustrating a method 300 of operating circuit 200, in accordance with some embodiments.

In step 305, a memory cell MC is identified/selected for reading.

In step 310, read bit line RBL corresponding to the selected memory cell (e.g., read bit line RBL[1]) is pre-charged to a High. The data stored in memory cell affects the logic level at read bit line RBL[1]. In some embodiments, when the data is LOW, read bit line RBL[1] is High, and when the data is High, read bit line RBL[1] is Low.

In step 315, a circuit SUB-MUX corresponding to read bit line RBL[1] (e.g., circuit SUB-MUX[1]), is selected, e.g., based on address Addrs.

In step 320, clock CLK is driven High, which turns on transistor MN2 in circuit SUB-MUX[1] and transistor MN1.

Based on the data stored in memory cell MC, if read bit line RBL[1] is High, transistor MN3 is turned on. Because transistors MN1, MN2, and MN3 are on, node MUX_Pout is pulled to the logic level of the source of transistor MN3, which is ground, or Low. As a result, output DATA_OUT is High, indicating the logic level of read bit line RBL[1]. If, however, read bit line RBL[1] is Low, transistor MP1 is on, output MUX_Pout is High based on voltage VDD of transistor MP1. As a result, output DATA_OUT is Low, indicating the logic level of read bit line RBL[1].

In step 325, the data at output DATA_OUT is processed to indicate the data stored in memory cell MC. In some embodiments, when the data is LOW, read bit line RBL[1] and thus output DATA_OUT is High. Output DATA_OUT is inverted to a LOW to indicate the stored data. When the memory data, however, is High, read bit line RBL[1] and thus output DATA_OUT is Low. Output DATA_OUT is also inverted to a High to indicate the stored data.

In FIG. 3, read bit line RBL[1] and corresponding circuit SUB-MUX[1] are used for illustration. Other read bit lines and corresponding circuits SUB-MUX operate in the same manner as would be recognizable by persons of ordinary skill in the art.

A number of embodiments have been described. It will nevertheless be understood that various modifications may be made without departing from the spirit and scope of the disclosure. For example, the various transistors being shown as a particular dopant type (e.g., NMOS and PMOS) are for illustration purposes, embodiments of the disclosure are not limited to a particular dopant type, but selection of different dopant types for a particular transistor is within the scope of various embodiments. The logic level (e.g., low or high) of the various signals used in the above description is also for illustration purposes, various embodiments are not limited to a particular level when a signal is activated and/or deactivated, but, rather, selecting such a level is a matter of design choice. Other circuitry performing functions of a transistor (e.g., transistor MN1, MP1), a group of transistors (e.g. transistors MN1, MN2, and MN2) are within the scope of various embodiments.

Some embodiments regard a method of outputting data using a multiplexer having a plurality of sub-circuits. Each output of the plurality of sub-circuits is coupled to a drain of a first NMOS transistor. The method includes: selecting a sub-circuit of the plurality of sub-circuits; changing a clock logic level at a clock line coupled to a first input of the selected sub-circuit to turn on the first NMOS transistor and a second NMOS transistor; a source of the first NMOS transistor coupled to a drain of the second NMOS transistor; and generating an output logic level at an output of the selected sub-circuit based on a data logic level of a data line coupled to a second input of the selected sub-circuit.

Some embodiments regard a method of outputting data using a multiplexer. The multiplexer has a plurality of sub-circuits, and each of the plurality of sub-circuits comprises a first transistor, a second transistor, and a third transistor. Drains of the first transistors are coupled with a first terminal of a fourth transistor, and drains of the second transistors are coupled with a second terminal of the fourth transistor. The method includes turning on the second transistor of a selected one of the plurality of sub-circuits responsive to a clock signal and address information. The second transistor of a non-selected one of the plurality of sub-circuits is turned off. The fourth transistor is turned on responsive to the clock signal. The drain of the fourth transistor is coupled to a first power node via the first transistor of the selected one of the plurality of sub-circuits or to a second power node via the second and third transistors of the selected one of the plurality of sub-circuits responsive to a corresponding read data signal.

Some embodiments regard a method of operating a multiplexer. The multiplexer has a plurality of sub-circuits, and each of the plurality of sub-circuits comprises a first P-type transistor, a first N-type transistor, and a second N-type transistor. Drains of the first P-type transistors are coupled with a drain of a third N-type transistor, and drains of the first N-type transistors are coupled with a source of the third N-type transistor. The method includes turning on the first N-type transistor of a selected one of the plurality of sub-circuits responsive to a clock signal and address information. The first N-type transistor of a non-selected one of the plurality of sub-circuits is turned off. The third N-type transistor is turned on responsive to the clock signal. The drain of the third N-type transistor is coupled to a first power node via the first P-type transistor of the selected one of the plurality of sub-circuits or to a second power node via the first and second N-type transistors of the selected one of the plurality of sub-circuits responsive to a corresponding read data signal.

The above methods show exemplary steps, but they are not necessarily performed in the order shown. Steps may be added, replaced, changed order, and/or eliminated as appropriate, in accordance with the spirit and scope of disclosed embodiments.

What is claimed is:

1. A method of outputting data using a multiplexer having a plurality of sub-circuits, each output of the plurality of sub-circuits coupled to a drain of a first NMOS transistor, the method comprising:
    selecting a sub-circuit of the plurality of sub-circuits;
    changing a clock logic level at a clock line coupled to a first input of the selected sub-circuit to turn on the first NMOS transistor and a second NMOS transistor; a source of the first NMOS transistor coupled to a drain of the second NMOS transistor; and
    generating an output logic level at an output of the selected sub-circuit based on a data logic level of a data line coupled to a second input of the selected sub-circuit.

2. The method of claim 1, wherein generating the output logic level includes generating a first output logic level when a first data logic level of the data line turns on a PMOS transistor; a drain of the PMOS transistor coupled to the output, and a source of the PMOS transistor coupled to a voltage supply node.

3. The method of claim 1, wherein generating the output logic level includes generating a first output logic level when a first data logic level of the data line turns on a third NMOS transistor; a drain of the third NMOS transistor coupled to a source of the second NMOS transistor.

4. The method of claim 1, wherein the data logic level of the data line corresponds to a memory logic level of a memory cell corresponding to the data line.

5. The method of claim 1, further comprising processing the output logic level at the output of the selected sub-circuit to reveal a memory logic level of a memory cell corresponding to the data line.

6. The method of claim 1, wherein each sub-circuit of the plurality of sub-circuits corresponds to a column of a memory array.

7. A method of outputting data using a multiplexer, the multiplexer having a plurality of sub-circuits, each of the plurality of sub-circuits comprising a first transistor, a second transistor, and a third transistor, the method comprising:
    turning on the second transistor of a selected one of the plurality of sub-circuits responsive to a clock signal and address information;
    turning off the second transistor of a non-selected one of the plurality of sub-circuits;
    turning on a fourth transistor responsive to the clock signal, the fourth transistor having a first terminal coupled with drains of the first transistors of the plurality of sub-circuits and a second terminal coupled with drains of the second transistors of the plurality of sub-circuits; and
    coupling the first terminal of the fourth transistor to a first power node via the first transistor of the selected one of the plurality of sub-circuits or to a second power node via the second and third transistors of the selected one of the plurality of sub-circuits responsive to a corresponding read data signal.

8. The method of claim 7, further comprising:
    turning off the first transistor of the non-selected one of the plurality of sub-circuits responsive to the clock signal and the address information.

9. The method of claim 7, further comprising:
    maintaining a logic value at the first terminal of the fourth transistor by a latch after the fourth transistor is turned off.

10. The method of claim 7, further comprising:
    supplying a logic high voltage level at the first power node; and
    supplying a logic low voltage level at the second power node.

11. The method of claim 7, further comprising:
    turning off the first transistor of the non-selected one of the plurality of sub-circuits.

12. The method of claim 11, wherein the turning off the first transistor of the non-selected one of the plurality of sub-circuits comprises:
    turning on a fifth transistor of the non-selected one of the plurality of sub-circuits to couple a gate of the first transistor of the non-selected one of the plurality of sub-circuits with the first power node.

13. The method of claim 7, wherein the turning on the second transistor of the selected one of the plurality of sub-circuits is performed by applying a logic high voltage level at a gate of the second transistor of the selected one of the plurality of sub-circuits.

14. The method of claim 7, wherein the turning off the second transistor of the non-selected one of the plurality of sub-circuits is performed by applying a logic low voltage level at a gate of the second transistor of the non-selected one of the plurality of sub-circuits.

15. The method of claim 7, wherein the turning on the fourth transistor is performed by applying a logic high voltage level at a gate of the fourth transistor.

16. A method of operating a multiplexer, the multiplexer having a plurality of sub-circuits, each of the plurality of sub-circuits comprising a first P-type transistor, a first N-type transistor, and a second N-type transistor, drains of the first P-type transistors coupled with a drain of a third N-type transistor, and drains of the first N-type transistors coupled with a source of the third N-type transistor, the method comprising:

turning on the first N-type transistor of a selected one of the plurality of sub-circuits responsive to a clock signal and address information;
turning off the first N-type transistor of a non-selected one of the plurality of sub-circuits;
turning on the third N-type transistor responsive to the clock signal; and
coupling the drain of the third N-type transistor to a first power node via the first P-type transistor of the selected one of the plurality of sub-circuits or to a second power node via the first and second N-type transistors of the selected one of the plurality of sub-circuits responsive to a corresponding read data signal.

17. The method of claim 16, further comprising:
turning off the first P-type transistor of the non-selected one of the plurality of sub-circuits responsive to the clock signal and the address information.

18. The method of claim 16, further comprising:
maintaining a logic value at the drain of the third N-type transistor by a latch after the third N-type transistor is turned off.

19. The method of claim 16, further comprising:
turning off the first P-type transistor of the non-selected one of the plurality of sub-circuits.

20. The method of claim 19, wherein the turning off the first P-type transistor of the non-selected one of the plurality of sub-circuits comprises:
turning on a second P-type transistor of the non-selected one of the plurality of sub-circuits to couple a gate of the first P-type transistor of the non-selected one of the plurality of sub-circuits with the first power node.

* * * * *